United States Patent
Shih

(10) Patent No.: US 10,833,052 B2
(45) Date of Patent: Nov. 10, 2020

(54) MICROELECTRONIC PACKAGE UTILIZING EMBEDDED BRIDGE THROUGH-SILICON-VIA INTERCONNECT COMPONENT AND RELATED METHODS

(71) Applicant: Micron Technology, Inc., Boise, ID (US)

(72) Inventor: Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/286,582

(22) Filed: Oct. 6, 2016

(65) Prior Publication Data

US 2018/0102311 A1     Apr. 12, 2018

(51) Int. Cl.
*H01L 23/00* (2006.01)
*H01L 21/48* (2006.01)
(Continued)

(52) U.S. Cl.
CPC ........ *H01L 25/0655* (2013.01); *H01L 21/486* (2013.01); *H01L 21/4857* (2013.01);
(Continued)

(58) Field of Classification Search
CPC ............... H01L 21/486; H01L 21/4857; H01L 23/49822; H01L 23/49827;
(Continued)

(56) References Cited

U.S. PATENT DOCUMENTS 7,402,901 B2 * 7/2008 Hatano ............... H01L 23/5389
  257/684
8,349,649 B2 * 1/2013 Kurita ................. H01L 23/3121
  257/686
(Continued)

FOREIGN PATENT DOCUMENTS

CN     102543927 A    7/2012
CN     103094244 A    5/2013
(Continued)

OTHER PUBLICATIONS

Taiwanese Search Report, dated Jul. 26, 2017, and Office Action, dated Aug. 11, 2017, for Taiwanese Application No. 105135626, 7 pages with English translation.
(Continued)

*Primary Examiner* — Zandra V Smith
*Assistant Examiner* — Abbigale A Boyle
(74) *Attorney, Agent, or Firm* — TraskBritt

(57) ABSTRACT

A semiconductor package includes a resin molded package substrate comprising a resin molded core, a plurality of metal vias in the resin molded core, a front-side RDL structure, and a back-side RDL structure. A bridge TSV interconnect component is embedded in the resin molded core. The bridge TSV interconnect component has a silicon substrate portion, an RDL structure integrally constructed on the silicon substrate portion, and TSVs in the silicon substrate portion. A first semiconductor die and a second semiconductor die are mounted on the front-side RDL
(Continued)

structure. The first semiconductor die and the second semiconductor die are coplanar.

16 Claims, 14 Drawing Sheets

(51) Int. Cl.
*H01L 23/538* (2006.01)
*H01L 23/498* (2006.01)
*H01L 25/065* (2006.01)
*H01L 23/14* (2006.01)

(52) U.S. Cl.
CPC .. *H01L 23/49827* (2013.01); *H01L 23/49838* (2013.01); *H01L 23/5381* (2013.01); *H01L 23/5383* (2013.01); *H01L 23/5386* (2013.01); *H01L 24/16* (2013.01); *H01L 23/147* (2013.01); *H01L 23/49816* (2013.01); *H01L 23/5384* (2013.01); *H01L 23/5385* (2013.01); *H01L 2224/16227* (2013.01); *H01L 2224/18* (2013.01)

(58) Field of Classification Search
CPC ........... H01L 23/49838; H01L 23/5381; H01L 23/5383; H01L 23/5386; H01L 25/0655; H01L 45/1226; H01L 2224/4013; H01L 2224/4813
See application file for complete search history.

(56) References Cited

U.S. PATENT DOCUMENTS

| | | | |
|---|---|---|---|
| 8,872,349 B2 * | 10/2014 | Chiu | H01L 23/5381 257/774 |
| 8,873,245 B2 * | 10/2014 | Kim | H01L 25/0657 361/761 |
| 9,147,638 B2 * | 9/2015 | Liu | H01L 23/48 |
| 9,257,368 B2 * | 2/2016 | Goh | H01L 21/50 |
| 9,418,965 B1 * | 8/2016 | Li | H01L 25/0655 |
| 9,425,159 B2 * | 8/2016 | Terui | H01L 24/19 |
| 9,831,148 B2 * | 11/2017 | Yu | H01L 24/98 |
| 10,163,856 B2 * | 12/2018 | Chen | H01L 23/49838 |
| 2010/0133704 A1 * | 6/2010 | Marimuthu | H01L 21/565 257/778 |
| 2011/0204505 A1 | 8/2011 | Pagaila | |
| 2012/0146209 A1 | 6/2012 | Hu et al. | |
| 2012/0273960 A1 | 11/2012 | Park | |
| 2013/0105213 A1 | 5/2013 | Hu et al. | |
| 2015/0102477 A1 | 4/2015 | Qian et al. | |
| 2015/0340303 A1 | 11/2015 | Oh et al. | |
| 2016/0085899 A1 * | 3/2016 | Qian | G06F 17/5077 257/774 |
| 2016/0141234 A1 | 5/2016 | We et al. | |

FOREIGN PATENT DOCUMENTS

| | | |
|---|---|---|
| TW | 201411782 A | 3/2014 |
| TW | 201503298 A | 1/2015 |
| TW | M521807 U | 5/2016 |

OTHER PUBLICATIONS

Chinese Office Action and Search Report for Chinese Application No. 201710081919.1, dated Mar. 28, 2019, 17 pages.

* cited by examiner

MICROELECTRONIC PACKAGE UTILIZING EMBEDDED BRIDGE THROUGH-SILICON-VIA INTERCONNECT COMPONENT AND RELATED METHODS

TECHNICAL FIELD

The present disclosure relates generally to the field of semiconductor packaging. More particularly, the present disclosure relates to a 2.5D wafer level package (WLP) utilizing a resin molded package substrate with an embedded bridge through-silicon-via (TSV) interconnect component.

BACKGROUND 2.5D semiconductor package such as CoWoS (Chip-On-Wafer-On-Substrate) is known in the art. CoWoS (Chip-on-Wafer-on-Substrate) typically uses Through-Silicon-Via (TSV) technology to integrate multiple chips into a single device.

This architecture provides higher density interconnects, decreases global interconnect length, and lightens associated RC loading resulting in enhanced performance and reduced power consumption on a smaller form factor.

Conventionally, a 2.5D semiconductor package places several dies side-by-side on a TSV silicon interposer. The dies are attached to the silicon interposer using microbumps, which are about 10 µm in diameter. The silicon interposer is attached to a package substrate using C4 bumps, which are about 100 µm in diameter.

BRIEF SUMMARY

The present disclosure is directed to provide an improved 2.5D semiconductor package utilizing a resin molded package substrate with an embedded bridge through-silicon-via (TSV) interconnect component.

According to one aspect of the invention, a semiconductor package comprises a resin molded package substrate comprising a resin molded core, a plurality of metal vias extending between a front surface and a back surface of the resin molded core, a front-side redistribution layer (RDL) structure integrally constructed on the front surface of the resin molded core, and a back-side RDL structure integrally constructed on the back surface of the resin molded core.

A bridge through-silicon-via (TSV) interconnect component is embedded in the resin molded core, wherein the bridge TSV interconnect component comprises a silicon substrate portion, a redistribution layer (RDL) structure integrally constructed on the silicon substrate portion, and a plurality of through-silicon-vias (TSVs) in the silicon substrate portion.

A plurality of connecting elements is embedded in the resin molded core. The plurality of connecting elements is interposed between the RDL structure of the bridge TSV interconnect component and the front-side RDL structure.

A first semiconductor die is mounted on the front-side RDL structure. A second semiconductor die is mounted on the front-side RDL structure. The first semiconductor die and the second semiconductor die are coplanar. A plurality of solder balls is formed on a lower surface of the back-side RDL structure.

According to another aspect of the invention, a method for fabricating a semiconductor package is disclosed. A first carrier is provided. A template layer is formed on the first carrier. Via openings are formed in the template layer. Metal vias are then formed in the via openings, respectively. The template layer is removed, leaving the metal vias intact on the first carrier. A bridge through-silicon-via (TSV) interconnect component is then installed on the first carrier.

A molding compound is formed to encapsulate the metal vias and the TSV interconnect component. A grinding process is performed to grind the molding compound and the bridge TSV interconnect component to thereby expose through-silicon-vias (TSVs) of the bridge TSV interconnect component and the metal vias embedded in the molding compound.

A back-side redistribution layer (RDL) structure is then formed on the molding compound. Solder balls are formed on the back-side RDL structure. The first carrier is then removed. The solder balls are attached to a second carrier. A front-side redistribution layer (RDL) structure is then formed on the molding compound. A first semiconductor die and a second semiconductor die are mounted on the front-side RDL structure. The second carrier is then removed.

These and other objectives of the present invention will no doubt become obvious to those of ordinary skill in the art after reading the following detailed description of the preferred embodiment that is illustrated in the various drawing figures.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
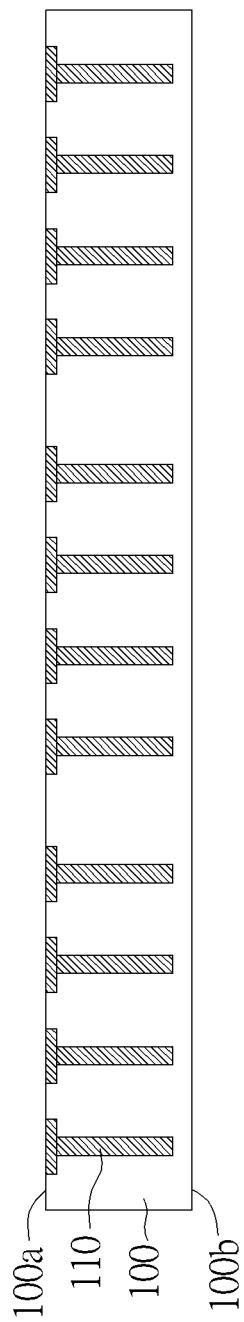
FIG. 1 to FIG. 3 are schematic diagrams showing a method for fabricating a bridge through-silicon-via (TSV) interconnect component according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale. The terms "die," "semiconductor chip," and "semiconductor die" are used interchangeably throughout the specification.

The terms "wafer" and "substrate" used herein include any structure having an exposed surface onto which a layer is deposited according to the present invention, for example, to form the circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

Figure 2:
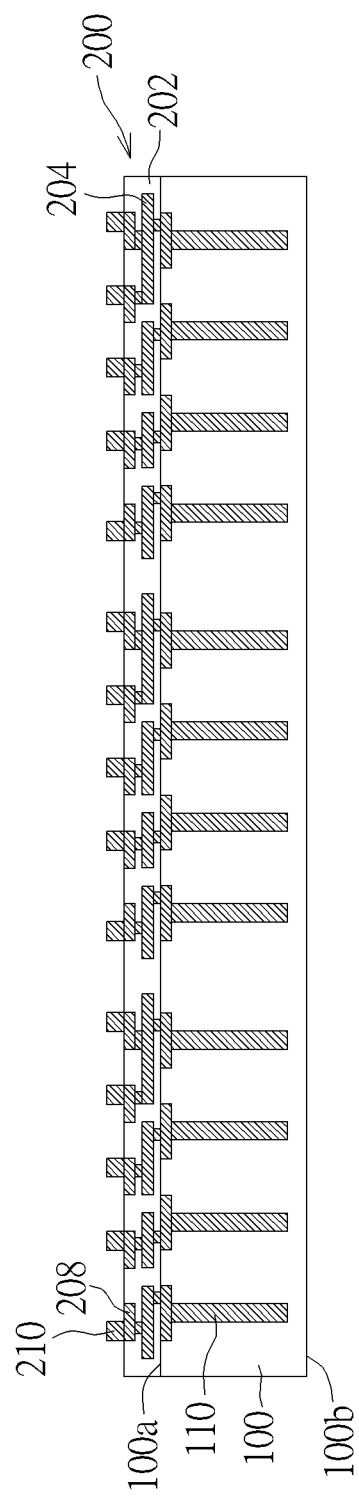
Figure 3:
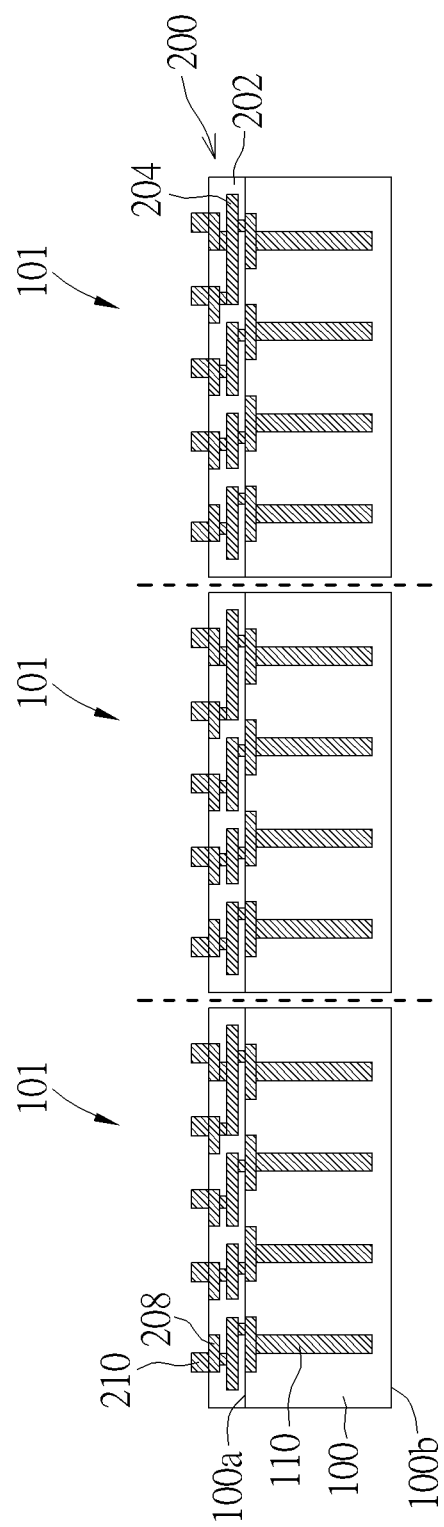

FIGS. 1 through 3 are schematic diagrams showing a method for fabricating a bridge through-silicon-via (TSV) interconnect component according to one embodiment of the invention.

As shown in FIG. 1, a semiconductor substrate (or wafer) 100 is provided. The semiconductor substrate 100 comprises a base material, such as silicon, germanium, gallium arsenide, indium phosphide, or silicon carbide, for structural support. Alternatively, the semiconductor substrate 100 may comprise polymer, beryllium oxide, or other suitable low-cost, rigid material for structural support. The semiconductor substrate 100 has opposing surfaces 100a and 100b.

A plurality of metal vias 110 is formed partially through the semiconductor substrate 100 using mechanical drilling, laser drilling, or deep reactive ion etching (DRIE), in combination with metal plating or deposition methods. The metal vias 110 extend from surface 100a partially but not completely through semiconductor substrate 100.

According to one embodiment, the metal vias 110 may comprise Al, Cu, Sn, Ni, Au, Ag, Ti, W, polysilicon, or other suitable electrically conductive materials that may be formed by using electrolytic plating, an electroless plating process, or other suitable deposition processes.

As shown in FIG. 2, redistribution layers (RDL) structure 200 for routing electrical signals is formed on the front surface 100a. The RDL structure 200 may comprise at least one dielectric layer 202 and at least one metal layer 204.

According to the embodiment, the dielectric layer 202 may comprise organic materials such as polyimide (PI) or inorganic materials such as silicon nitride, silicon oxide or the like, but is not limited thereto.

The metal layer 204 may comprise aluminum, copper, tungsten, titanium, titanium nitride, or the like. According to the illustrated embodiment, the metal layer 204 may comprise a plurality of fine-pitch traces, contact pads 208 exposed from a top surface of the dielectric layer 202. Connecting elements 210 such as micro-bumps may be formed on the contact pads 208. Portions of the metal layer 204 may be electrically connected to the metal vias 110.

It is understood that the layers and layout of the metal layer 204 and the contact pads 208 are for illustration purposes only. Depending upon design requirements, more layers of metal traces may be formed in the RDL structure 200 in other embodiments.

Subsequently, as shown in FIG. 3, the semiconductor substrate 100 having the RDL structure 200 is subjected to a singulation process and is cut into individual TSV interconnect components 101 by wafer dicing method.

FIGS. 4 through 14 are schematic, cross-sectional diagrams showing an exemplary method for fabricating a 2.5D semiconductor package utilizing a resin molded package substrate with an embedded bridge through-silicon-via (TSV) interconnect component, according to one embodiment of the invention.

Figure 4:
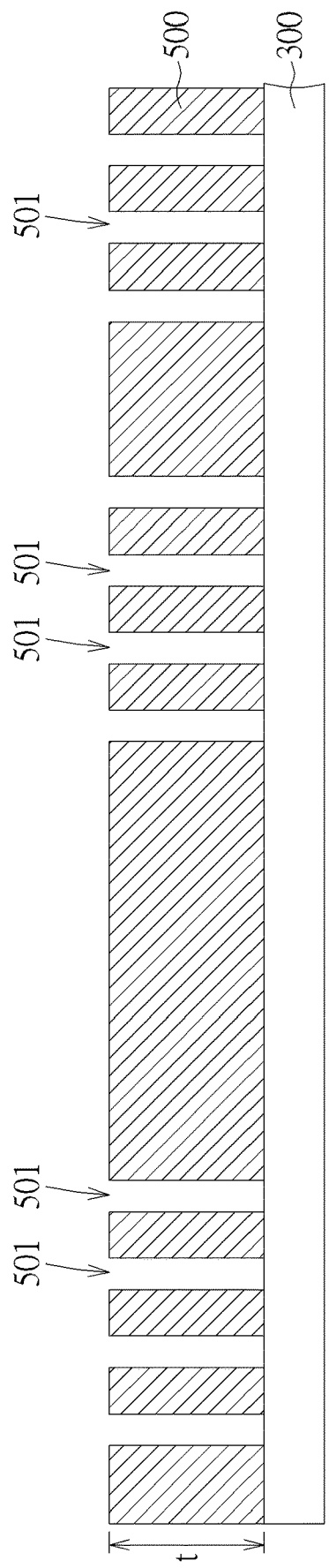
FIG. 4 to FIG. 14 are schematic, cross-sectional diagrams showing an exemplary method for fabricating a 2.5D semiconductor package utilizing a resin molded package substrate with an embedded bridge through-silicon-via (TSV) interconnect component according to one embodiment of the invention.

As shown in FIG. 4, a carrier 300 is prepared. The carrier 300 may be a releasable substrate material. The carrier 300 may comprise glass, silicon, ceramic, metal, or any suitable supporting materials. A dielectric layer or a passivation layer may be provided on a top surface of the carrier 300. The passivation layer may comprise organic materials such as polyimide (PI) or inorganic materials such as silicon nitride, silicon oxide or the like, but is not limited thereto.

Subsequently, a template layer 500 is coated on the carrier 300. For example, the template layer 500 may be a photoresist such as i-Line photoresist, or a Directed Self-Assembly (DSA) material, but is not limited thereto.

Via openings 501 are formed in the template layer 500 by using, for example, photolithographic processes. Each of the via openings 501 extends through the entire thickness of the template layer 500. According to the embodiment, the via openings 501 may have the same via diameter or dimension. According to other embodiments, the via openings 501 may have different via diameters.

Figure 5:
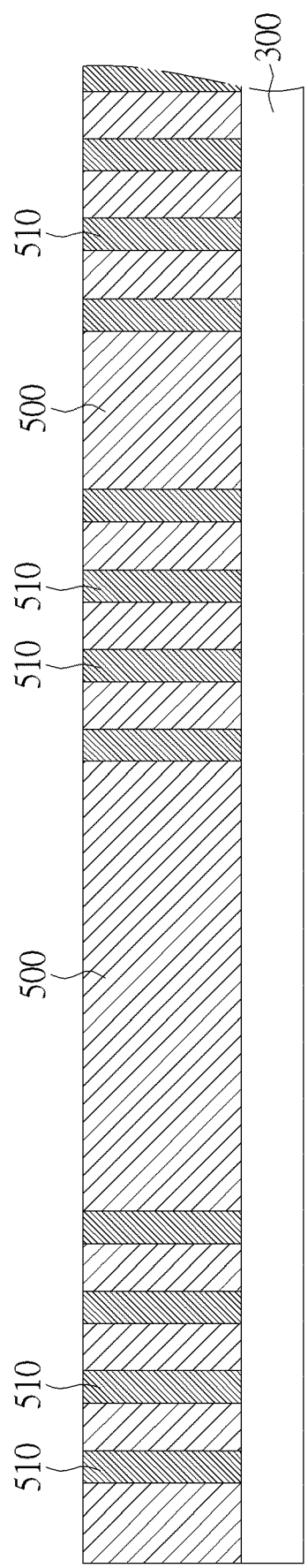

As shown in FIG. 5, after the formation of the via openings 501, metal vias 510 are formed within the via openings 501, respectively. According to the embodiment, the via openings 501 are completely filled with metal, such as copper, tungsten, aluminum, titanium, titanium nitride, or the like, to thereby form the metal vias 510. The metal vias 510 may be formed by deposition, screen printing, or any suitable methods.

Optionally, a chemical-mechanical polishing (CMP) process may be performed to remove excess metal outside the via openings 501. According to the embodiment, the metal vias 510 may have a height that is equal to the thickness t of the template layer 500. According to the embodiment, the metal vias 510 may have the same via diameter or dimension. According to other embodiments, the metal vias 510 may have different via diameters.

According to the embodiment, the metal vias 510 may function as an interconnect between the front-side RDL structure and the back-side RDL structure (for transmitting power or ground signals, for example), heat-dissipating features, or stress-adjusting features (dummy metal vias).

Figure 6:
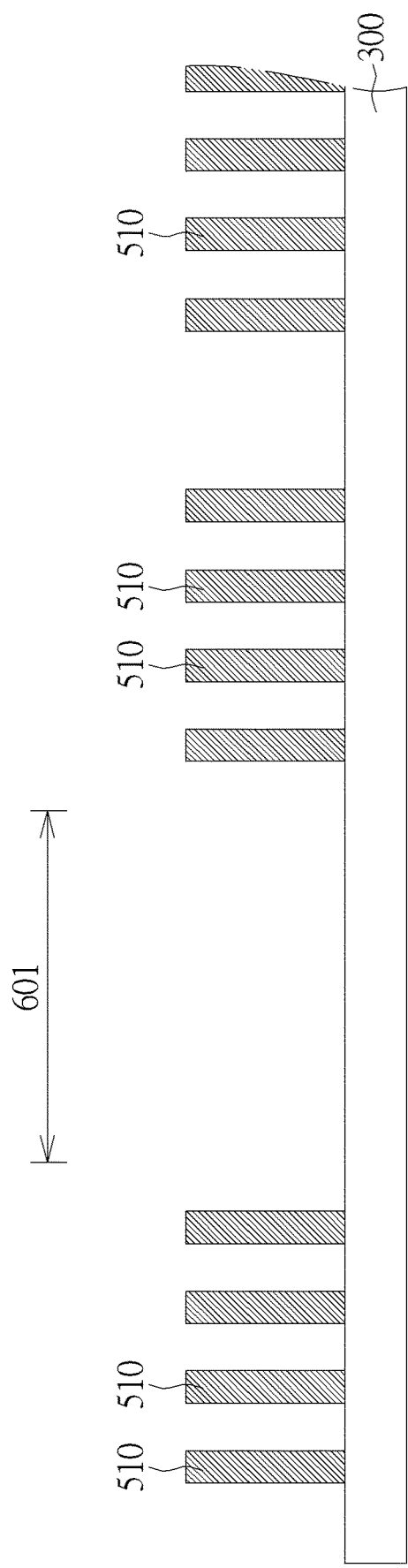

As shown in FIG. 6, after forming the metal vias 510, the template layer 500 is completely removed, leaving the metal vias 510 intact. For example, the template layer 500, when containing photoresist, may be removed by plasma etching or an ashing process. At this point, the pillar-shaped metal vias 510 are exposed. These pillar-shaped metal vias 510 surround a TSV interconnect component mounting area 601.

Figure 7:
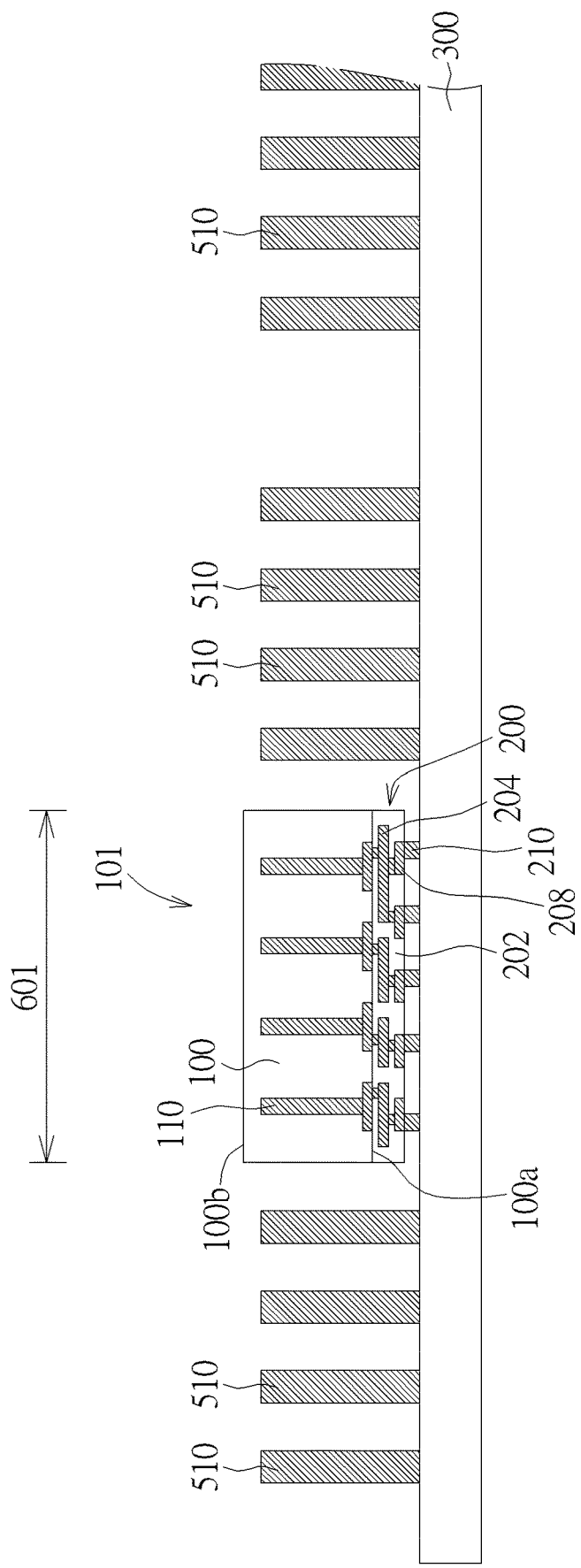

As shown in FIG. 7, the TSV interconnect component 101 as depicted in FIG. 3 is flipped 180 degrees and is installed on the carrier 300 within the TSV interconnect component mounting area 601. The connecting elements 210 may be in direct contact with the carrier 300. The metal vias 510 may have a greater diameter than that of the metal vias 110.

Figure 8:
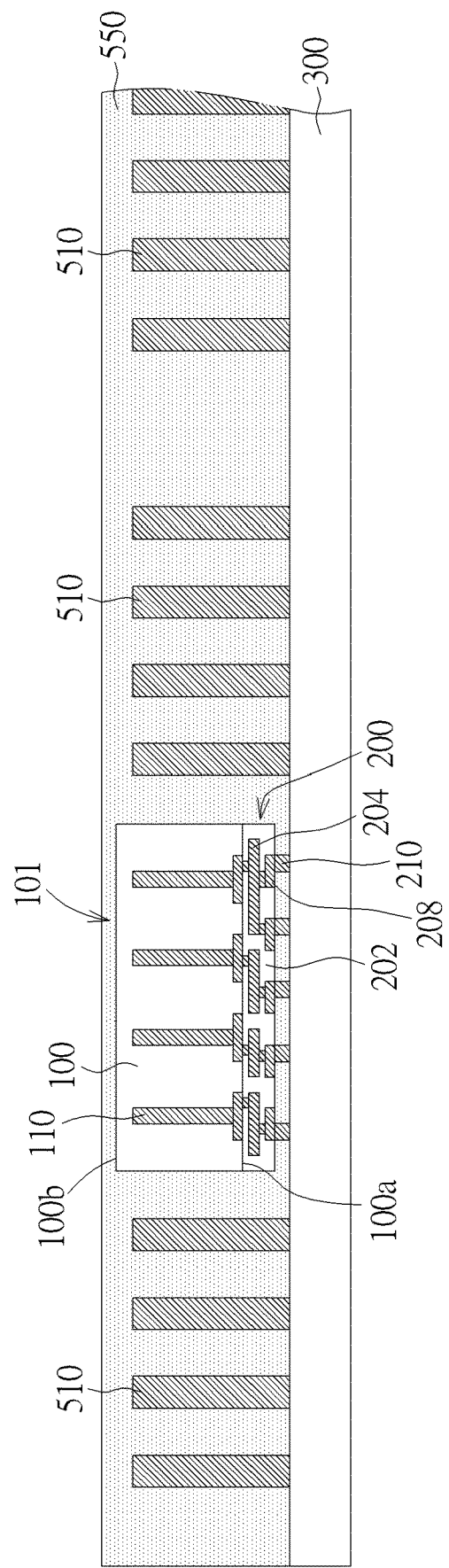

As shown in FIG. 8, a molding compound 550 is applied. The molding compound 550 covers and encapsulates the metal vias 510, the TSV interconnect component 101, and the top surface of the carrier 300. The molding compound 550 may be subjected to a curing process. The molding compound 550 may comprise a mixture of epoxy and silica fillers, but is not limited thereto. The layer of molding compound 550 is thicker than the thickness of the TSV interconnect component 101. The RDL structure 200 is embedded in the molding compound 550 (embedded RDL structure).

Figure 9:
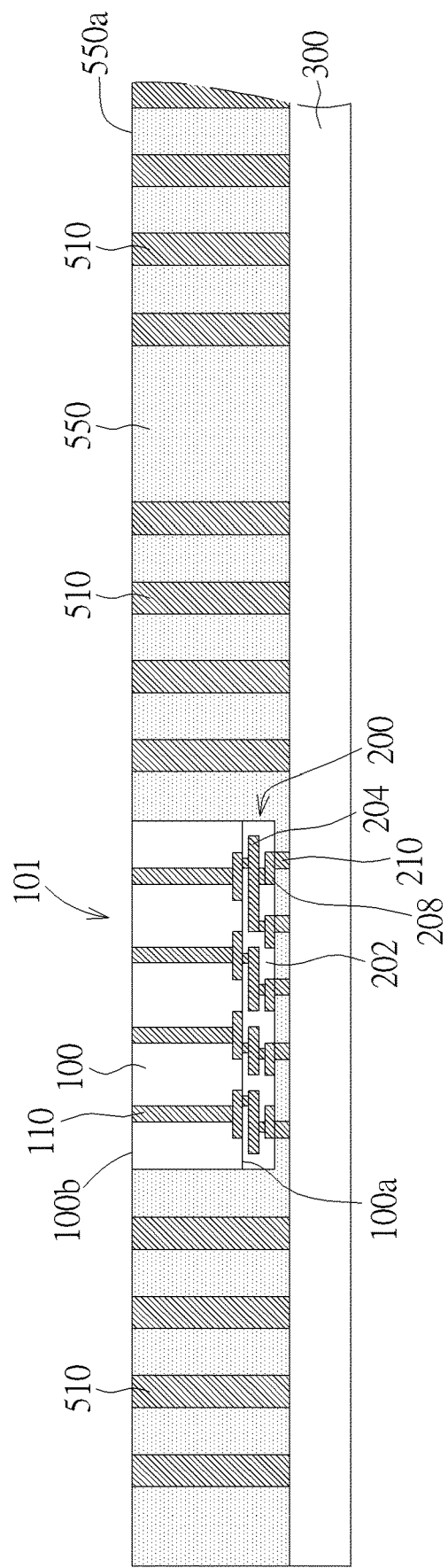

As shown in FIG. 9, a grinding process is performed. A top portion of the molding compound 550 is removed to expose top surfaces of the metal vias 510 and top surfaces of the metal vias 110. At this point, the back surface 100b is coplanar with a surface 550a of the molding compound 550.

Figure 10:
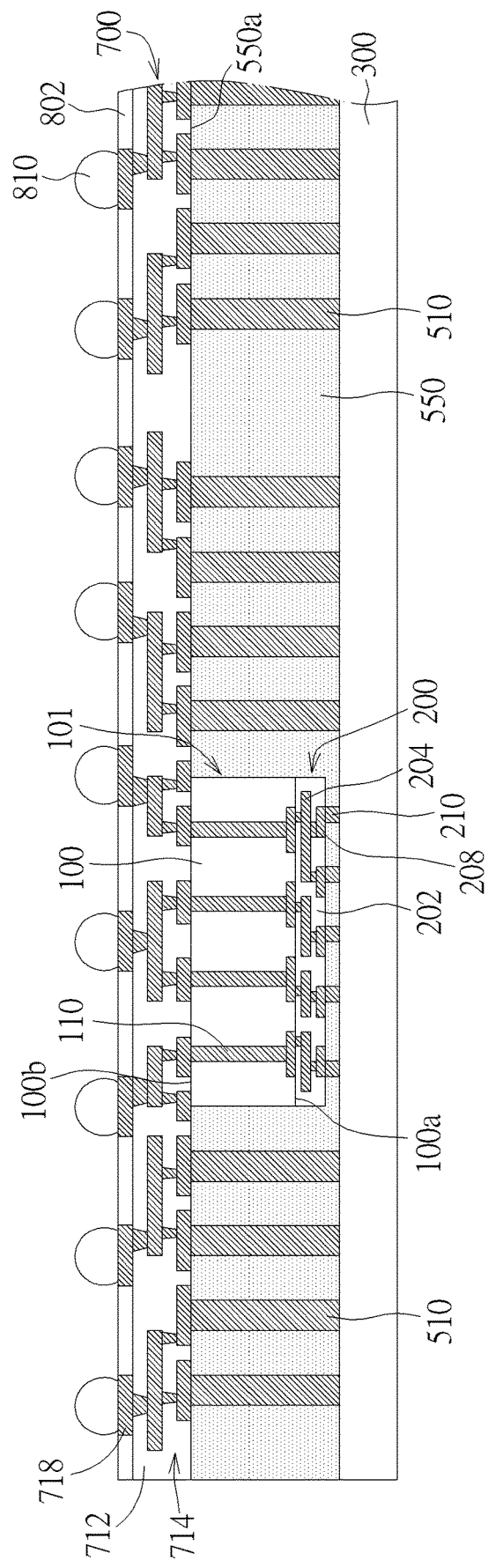

As shown in FIG. 10, a redistribution layer (RDL) structure 700 is formed on the molding compound 550 and on the metal vias 510. The RDL structure 700 acts as a back-side (or PCB-side) RDL structure. The RDL structure 700 may comprise at least one dielectric layer 712 and at least one metal layer 714.

According to the embodiment, the dielectric layer 712 may comprise organic materials such as polyimide (PI) or inorganic materials such as silicon nitride, silicon oxide or the like, but is not limited thereto.

The metal layer 714 may comprise aluminum, copper, tungsten, titanium, titanium nitride, or the like. According to the illustrated embodiment, the metal layer 714 may comprise a plurality of traces, contact pads 718 exposed from a top surface of the dielectric layer 712.

It is understood that the layers and layout of the metal layer 714 and the contact pads 718 are for illustration purposes only. Depending upon design requirements, more layers of metal traces may be formed in the RDL structure 700 in other embodiments.

Subsequently, solder balls 810 such as ball grid array (BGA) balls are formed on the contact pads 718. It is understood that a solder mask 802 may be formed on the RDL structure 700. Prior to the formation of the solder balls 810, an under-bump metallization (UBM) layer (not explicitly shown) may be formed on the contact pads 718.

Figure 11:
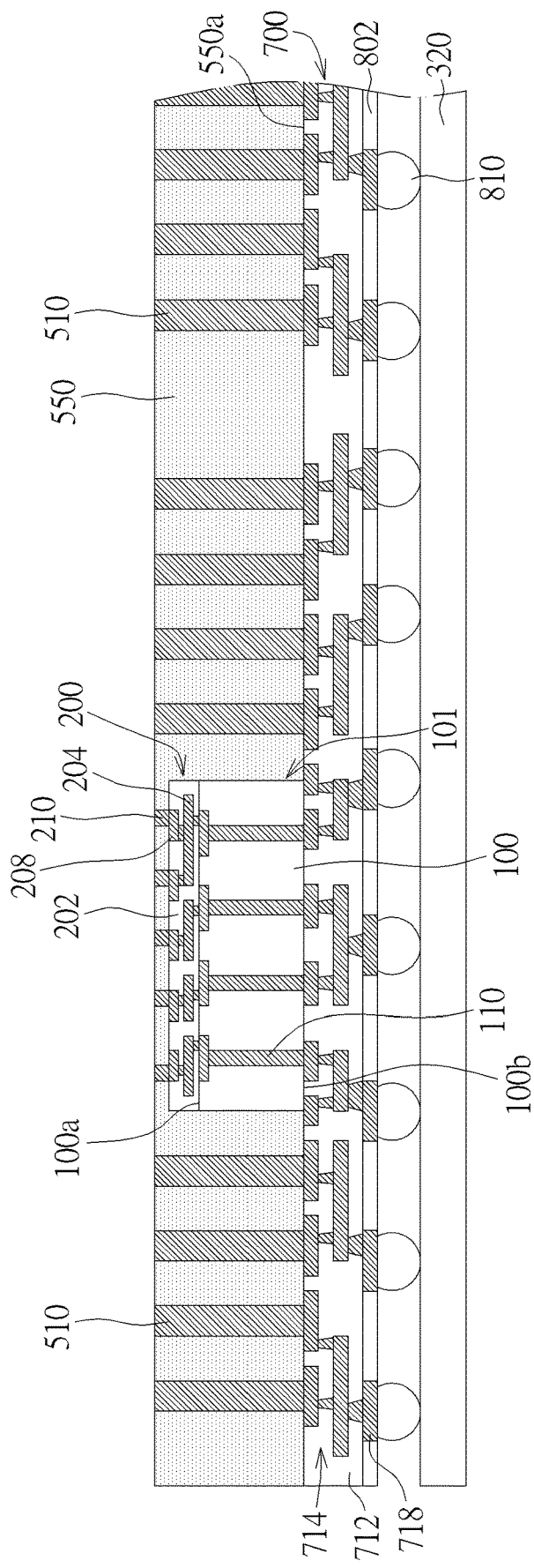

As shown in FIG. 11, the carrier 300 is then removed. The other ends of the metal vias 510 and top surfaces of the connecting elements 210 are exposed. The intermediate wafer level product is then bonded to a carrier 320 with the solder balls 810 in direct contact with the carrier 320. The carrier 320 may comprise glass, silicon, ceramic, metal, or any suitable supporting materials. An adhesive layer (not explicitly shown) may be provided on the carrier 320 and the solder balls 810 may be adhered to the carrier 320 by the adhesive layer.

Figure 12:
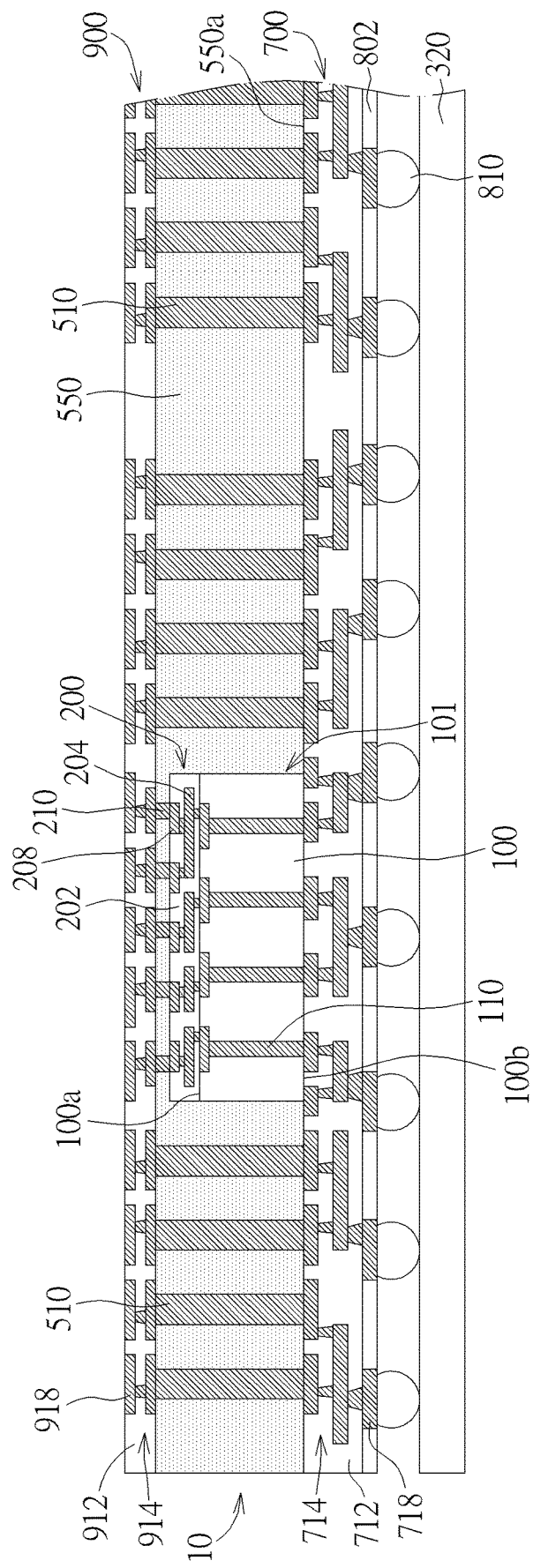

As shown in FIG. 12, a redistribution layer (RDL) structure 900 is formed on the molding compound 550, the metal vias 510, and the connecting elements 210. A resin molded package substrate 10 having a resin molded core (molding compound 550) is completed. The RDL structure 900 acts as a front-side (or die-side) RDL structure. The RDL structure 900 may comprise at least one dielectric layer 912 and at least one metal layer 914.

According to the embodiment, the dielectric layer 912 may comprise organic materials such as polyimide (PI) or inorganic materials such as silicon nitride, silicon oxide or the like, but is not limited thereto.

The metal layer 914 may comprise aluminum, copper, tungsten, titanium, titanium nitride, or the like. According to the illustrated embodiment, the metal layer 914 may comprise a plurality of traces, contact pads 918 exposed from a top surface of the dielectric layer 912.

It is understood that the layers and layout of the metal layer 914 and the contact pads 918 are for illustration purposes only. Depending upon design requirements, more layers of metal traces may be formed in the RDL structure 900 in other embodiments.

Figure 13:
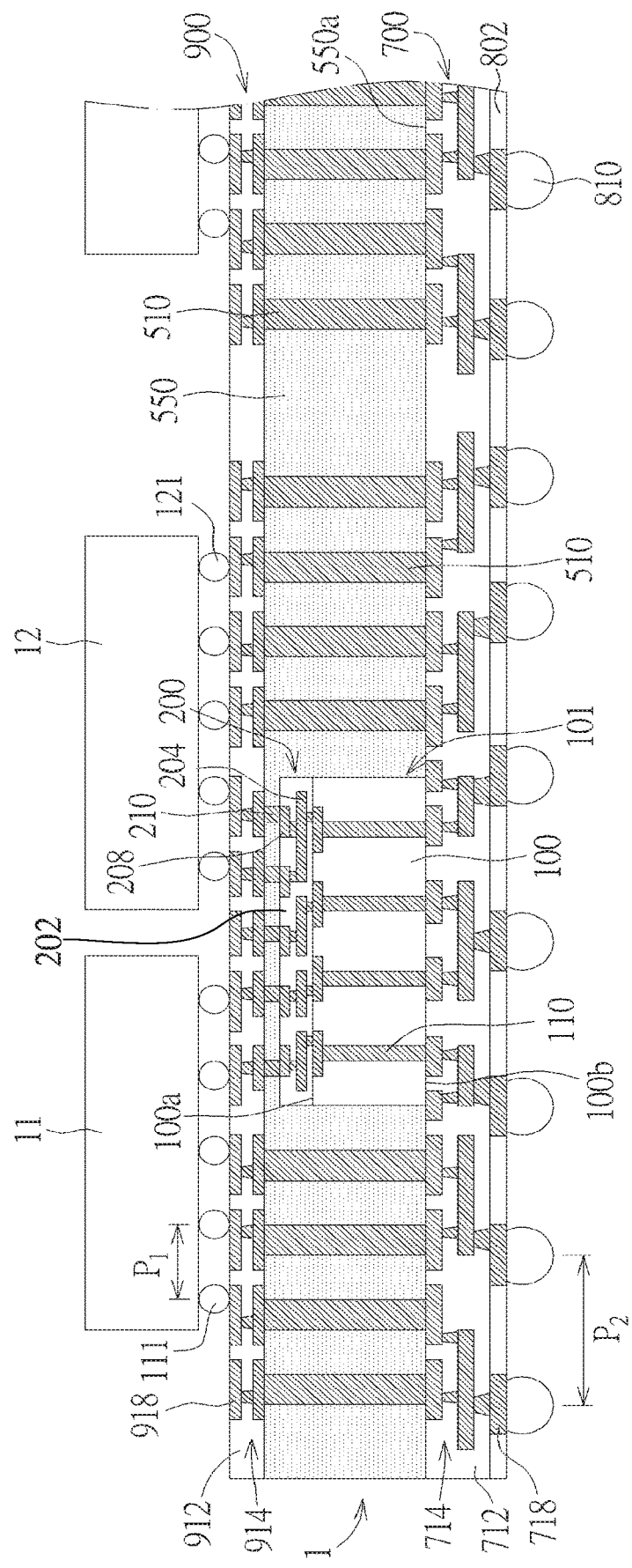

As shown in FIG. 13, a first semiconductor die 11 and a second semiconductor die 12 are mounted on the RDL structure 900. The first semiconductor die 11 and second semiconductor die 12 may be flip chips. The first semiconductor die 11 and second semiconductor die 12 are electrically connected to the RDL structure 900 through the contact pads 918 and metal bumps 111 and 121, respectively.

According to the embodiment, the metal bumps 111 and 121 have a bump pitch $P_1$ that is equal to the input/output (I/O) pad pitch on the first semiconductor die 11 and second semiconductor die 12. For example, the bump pitch $P_1$ may be smaller than 100 micrometers. The solder balls 810 may have a ball pitch $P_2$ that is equal to the ball pad pitch on a printed circuit board (PCB) or a system board.

Optionally, another molding compound may be applied onto the first semiconductor die 11 and second semiconductor die 12 by transfer molding, but is not limited thereto. Subsequently, the carrier 320 may be removed.

Figure 14:
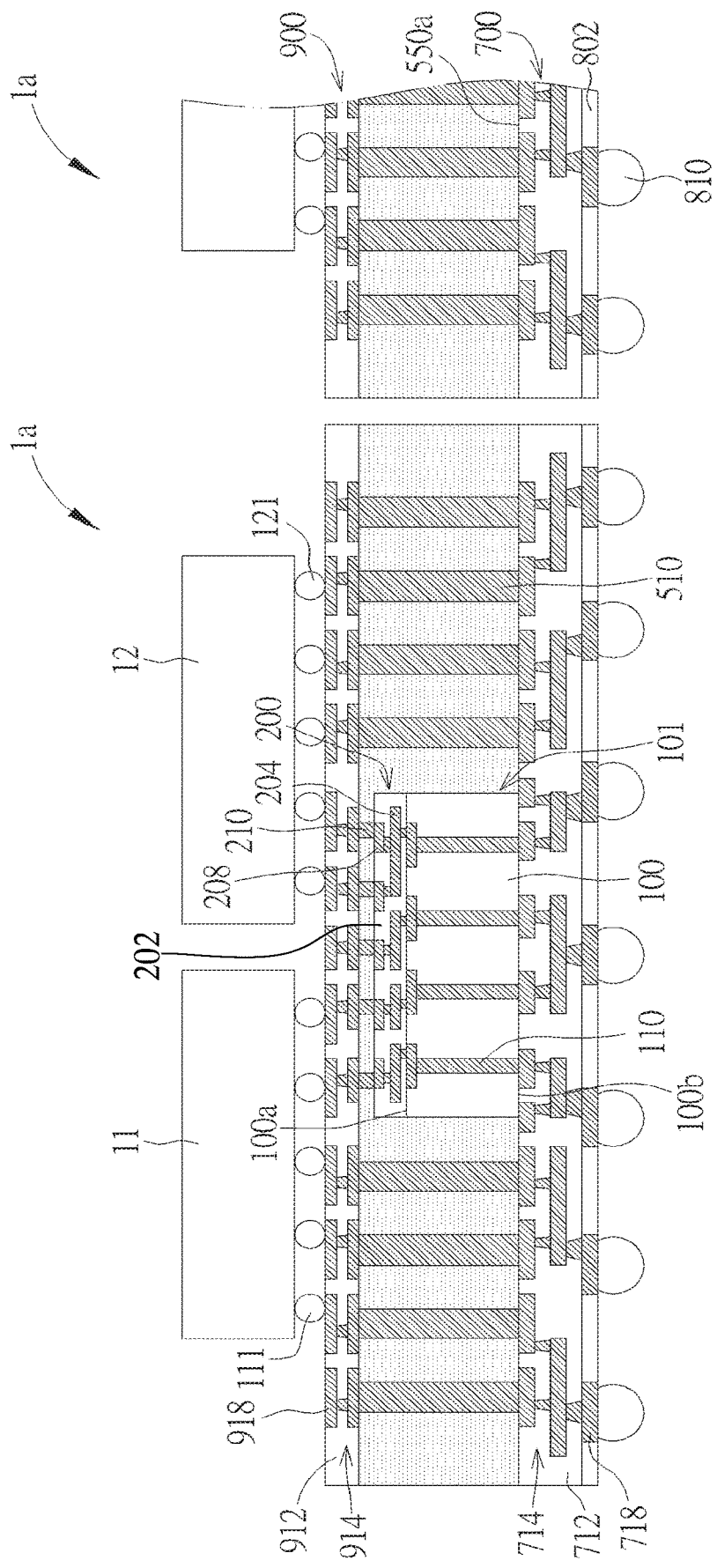

As shown in FIG. 14, the wafer level package 1 may be singulated into an individual 2.5D semiconductor package 1a by dicing. According to the embodiment, a conventional interposer device that is installed between the semiconductor die and the package substrate is omitted.

According to one aspect of the invention, the semiconductor package 1a comprises a resin molded package substrate 10 comprising a resin molded core (i.e., molding compound 550), a plurality of metal vias 510 extending between a front surface and a back surface of the resin molded core 550, a front-side redistribution layer (RDL) structure 900 integrally constructed on the front surface of the resin molded core 550, and a back-side RDL structure 700 integrally constructed on the back surface of the resin molded core 550. No gap is formed between the front-side RDL structure 900 and the resin molded core 550 or between the back-side RDL structure 700 and the resin molded core 550.

A bridge through-silicon-via (TSV) interconnect component 101 is embedded in the resin molded core 550, wherein the bridge TSV interconnect component 101 comprises a semiconductor substrate 100, a redistribution layer (RDL) structure 200 integrally constructed on the semiconductor substrate 100, and a plurality of through-silicon-via (TSV) interconnect components 101 in the semiconductor substrate 100.

A plurality of connecting elements 210 is embedded in the resin molded core 550. The plurality of connecting elements 210 is interposed between the RDL structure 200 of the bridge TSV interconnect component 101 and the front-side RDL structure 900.

A first semiconductor die 11 is mounted on the front-side RDL structure 900. A second semiconductor die 12 is mounted on the front-side RDL structure 900. The first semiconductor die 11 and the second semiconductor die 12 are coplanar. A plurality of solder balls 810 is formed on a lower surface of the back-side RDL structure 700.

According to the embodiment, the first semiconductor die 11 and the second semiconductor die 12 may be electrically connected to the RDL structure 700 through the RDL structure 900 and the metal vias 510. According to the embodiment, power or ground may be transmitted through the metal vias 510 because the larger diameter of the metal vias 510 is able to provide lower resistance and improved signal integrity.

According to the embodiment, the first semiconductor die 11 and the second semiconductor die 12 may be electrically coupled to each other through the RDL structure 900, or otherwise through the RDL structure 900, the connecting elements 210, and the RDL structure 200. Therefore, the TSV interconnect component 101 acts as a signal transmitting bridge between the first semiconductor die 11 and the second semiconductor die 12 and may be referred to as a bridge TSV interconnect component.

According to the embodiment, the first semiconductor die 11 and the second semiconductor die 12 may be electrically connected to the RDL structure 700 through the RDL structure 900, the connecting elements 210, the RDL structure 200, and the metal vias 110. For example, digital signals such as high-frequency signals or the like may be transmitted through this path.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A microelectronic package, comprising:
   a resin molded package substrate comprising a resin molded core, metal vias extending between a front surface and a back surface of the resin molded core, a front-side redistribution layer (RDL) structure integrally constructed directly on the front surface of the resin molded core, and a back-side RDL structure integrally constructed directly on the back surface of the resin molded core, wherein the resin molded core comprises a single layer of a single molding compound;
   a bridge through-silicon-via (TSV) interconnect component embedded in the resin molded core, wherein the bridge TSV interconnect component comprises a silicon substrate portion, an embedded RDL structure integrally constructed on the silicon substrate portion, and through-silicon-vias (TSVs) in the silicon substrate portion, wherein each of the front-side RDL structure, the back-side RDL structure, and the embedded RDL structure consists essentially of multiple layers of a dielectric material and metal segments located within openings of the dielectric material, and wherein the TSVs are physically and electrically connected directly to the back-side RDL structure with end surfaces of the TSVs on the back surface of the resin molded core nearest the back-side RDL structure being generally coplanar with end surfaces of the metal vias of the resin molded package substrate on the back surface of the resin molded core nearest the back-side RDL structure;
   connecting elements embedded within and directly contacting the single layer of the single molding compound of the resin molded core, wherein the connecting elements are located between the embedded RDL structure and the front-side RDL structure;
   a first die mounted on the front-side RDL structure;
   a second die mounted on the front-side RDL structure, wherein the first die and the second die are coplanar, wherein the first die and the second die are electrically connected to the back-side RDL structure through the front-side RDL structure and the metal vias extending between the front surface and the back surface of the resin molded core; and
   solder balls on a lower surface of the back-side RDL structure.

2. The microelectronic package of claim 1, wherein the first die and the second die are mounted on the front-side RDL structure through first metal bumps and second metal bumps, respectively.

3. The microelectronic package of claim 2, wherein the first metal bumps and second metal bumps have a bump pitch that is equal to an input/output (I/O) pad pitch of the first die and the second die.

4. The microelectronic package of claim 3, wherein the bump pitch is smaller than 100 micrometers.

5. The microelectronic package of claim 3, wherein the solder balls have a ball pitch that is equal to a ball pad pitch on a printed circuit board or a system board.

6. The microelectronic package of claim 1, wherein the metal vias are electrically coupled to transmit power or ground.

7. The microelectronic package of claim 1, wherein the first die and the second die are electrically coupled to each other through the front-side RDL structure, the connecting elements, and the embedded RDL structure.

8. The microelectronic package of claim 1, wherein the front-side RDL structure, the connecting elements, the embedded RDL structure, and the TSVs of the bridge TSV interconnect component are electrically coupled to transmit digital signals therethrough.

9. The microelectronic package of claim 1, wherein the bridge TSV interconnect component is encapsulated by the single layer of the single molding compound.

10. A method for fabricating a microelectronic package, comprising:
    providing a first carrier;
    forming a template layer on the first carrier;
    forming via openings in the template layer;
    forming metal vias in the via openings, respectively;
    removing the template layer and leaving the metal vias intact on the first carrier;
    installing a bridge through-silicon-via (TSV) interconnect component on the first carrier, the bridge TSV interconnect component comprising a silicon substrate portion, an embedded RDL structure integrally constructed on the silicon substrate portion, and through-silicon-vias (TSVs) formed in the silicon substrate portion, the embedded RDL structure consisting essentially of multiple layers of a dielectric material and metal segments located within openings of the dielectric material;
    forming connecting elements over the embedded RDL structure;
    forming a single layer of a single molding compound to encapsulate the metal vias, the bridge TSV interconnect component, and the connecting elements to form a resin molded core of a resin molded package substrate, the connecting elements being embedded within and directly contacting the single layer of the single molding compound of the resin molded core;
    grinding the single layer of the single molding compound and the bridge TSV interconnect component to expose the TSVs of the bridge TSV interconnect component and the metal vias extending between a front surface and a back surface of the resin molded core;
    forming a back-side redistribution layer (RDL) structure integrally constructed directly on the back surface of the resin molded core, the back-side RDL structure consisting essentially of multiple layers of other portions of the dielectric material and other metal segments formed within openings of the dielectric material, with the TSVs being physically and electrically connected directly to the back-side RDL structure such that end surfaces of the TSVs on the back surface of the resin molded core nearest the back-side RDL structure are generally coplanar with end surfaces of the metal vias of the resin molded package substrate on the back surface of the resin molded core nearest the back-side RDL structure;
    forming solder balls on the back-side RDL structure;
    removing the first carrier;
    attaching the solder balls to a second carrier;
    forming a front-side RDL structure integrally constructed directly on the front surface of the resin molded core, the front-side RDL structure consisting essentially of multiple layers of additional portions of the dielectric material and additional metal segments formed within openings of the dielectric material, the connecting elements positioned between the embedded RDL structure and the front-side RDL structure;
mounting a first die and a second die on the front-side RDL structure;
electrically connecting the first die and the second die to the back-side RDL structure through the front-side RDL structure and the metal vias extending between the front surface and the back surface of the resin molded core; and
removing the second carrier.

11. The method of claim 10, further comprising forming the template layer of a material comprising a photoresist or a Directed Self-Assembly (DSA) material.

12. The method of claim 10, wherein forming the metal vias comprises completely filling the via openings with metal.

13. The microelectronic package of claim 1, wherein a back surface of the bridge TSV interconnect component is coplanar with the back surface of the single layer of the single molding compound of the resin molded core.

14. The microelectronic package of claim 1, wherein:
uppermost regions of the metal material of the front-side RDL structure comprise contact regions located within and exposed at a top surface of the dielectric material; and
lowermost regions of the metal material of the back-side RDL structure comprise contact regions located within and exposed at a lower surface of the dielectric material, at least some of the contact regions in direct physical contact with the solder balls located on the lower surface of the back-side RDL structure.

15. The microelectronic package of claim 1, wherein:
the metal material comprises at least one of aluminum, copper, tungsten, titanium, or titanium nitride; and
the dielectric material comprises at least one of a polyimide material, a silicon nitride material, or a silicon oxide material.

16. The microelectronic package of claim 1, further comprising:
a first electrical pathway between the first die or the second die and the back-side RDL structure using only the front-side RDL structure and the metal vias of the resin molded package substrate; and
a second electrical pathway between the first die or the second die and the back-side RDL structure using only the front-side RDL structure, the connecting elements, the embedded RDL structure, and the TSVs of the bridge TSV interconnect component, the first electrical pathway being separate from the second electrical pathway.

* * * * *